United States Patent
Jin et al.

(10) Patent No.: US 9,621,368 B2
(45) Date of Patent: Apr. 11, 2017

(54) METHOD FOR DISPLAYING STATUS OF POWER CONSUMPTION AND PORTABLE DEVICE THEREOF

(75) Inventors: Young-kyu Jin, Seoul (KR); Young-ho Lee, Gyeonggi-do (KR); Il-ku Chang, Seoul (KR); Young-shil Jang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 684 days.

(21) Appl. No.: 13/396,278

(22) Filed: Feb. 14, 2012

(65) Prior Publication Data

US 2012/0268286 A1 Oct. 25, 2012

(30) Foreign Application Priority Data

Apr. 19, 2011 (KR) ........................ 10-2011-0036297

(51) Int. Cl.
*G09G 5/00* (2006.01)
*G09G 5/02* (2006.01)
(Continued)

(52) U.S. Cl.
CPC ........ *H04L 12/2807* (2013.01); *G01R 21/133* (2013.01); *G06F 3/0481* (2013.01);
(Continued)

(58) Field of Classification Search
CPC ...... G06F 3/0481; G06F 3/0482; G06T 11/60; G06T 19/00; G06T 19/006; G09G 5/14;
(Continued)

(56) References Cited

U.S. PATENT DOCUMENTS 8,751,973 B2 6/2014 Han et al.
2002/0065618 A1* 5/2002 Oh ........................ G06F 1/3203
702/57

(Continued)

FOREIGN PATENT DOCUMENTS

CN 101075820 11/2007
EP 2 377 228 12/2012
(Continued)

OTHER PUBLICATIONS

Lapides, P.; Sharlin, E.; Greenberg, S., "HomeWindow: An augmented reality domestic monitor," Human-Robot Interaction (HRI), 2009 4th ACM/IEEE International Conference on , vol., No., pp. 323,324, Mar. 11-13, 2009.*
(Continued)

*Primary Examiner* — Ke Xiao
*Assistant Examiner* — Andrew Shin
(74) *Attorney, Agent, or Firm* — The Farrell Law Firm, P.C.

(57) ABSTRACT

Provided is a method for displaying electricity use status and a portable device thereof by identifying at least one electronic appliance in an image on a screen captured through a camera, receiving electricity use information of the at least one electronic appliance, determining the electricity use status of the at least one electronic appliance using the received electricity use information, and displaying one of a plurality of Graphical User Interfaces (GUI), wherein each GUI corresponds to a different stage of the electricity use status of the at least one electronic appliance.

19 Claims, 12 Drawing Sheets

(51) Int. Cl.
  *G06K 9/00* (2006.01)
  *G06K 9/46* (2006.01)
  *G06F 3/048* (2013.01)
  *G01R 21/00* (2006.01)
  *H04L 12/28* (2006.01)
  *G01R 21/133* (2006.01)
  *G06F 3/0482* (2013.01)
  *G06K 9/48* (2006.01)
  *G06F 3/0481* (2013.01)
  *G06T 11/00* (2006.01)
  *G09G 5/14* (2006.01)
  *G06T 11/60* (2006.01)

(52) U.S. Cl.
  CPC .............. *G06F 3/0482* (2013.01); *G06K 9/00* (2013.01); *G06K 9/48* (2013.01); *G06T 11/001* (2013.01); *G06T 11/60* (2013.01); *G09G 5/02* (2013.01); *G09G 5/14* (2013.01)

(58) Field of Classification Search
  CPC .......... G01R 21/133; G06K 9/00; G06K 9/48; G06K 9/4647; G06K 9/6203
  USPC .............. 345/581, 589, 619, 629, 632, 633; 382/181, 203, 206, 209, 216; 715/764, 715/781, 810, 811, 821, 823, 835; 702/60–63
  See application file for complete search history.

(56) References Cited

U.S. PATENT DOCUMENTS

| | | | |
|---|---|---|---|
| 2004/0225649 A1* | 11/2004 | Yeo et al. .......................... | 707/3 |
| 2007/0271525 A1 | 11/2007 | Han et al. | |
| 2009/0125825 A1* | 5/2009 | Rye et al. ..................... | 715/764 |
| 2009/0148074 A1 | 6/2009 | Xu et al. | |
| 2009/0232417 A1* | 9/2009 | McMahan ..................... | 382/309 |
| 2010/0156666 A1 | 6/2010 | Choi et al. | |
| 2010/0191487 A1 | 7/2010 | Rada et al. | |
| 2010/0317332 A1* | 12/2010 | Bathiche et al. ............. | 455/418 |
| 2011/0055745 A1* | 3/2011 | Penney et al. ................ | 715/771 |
| 2011/0072378 A1 | 3/2011 | Nurminen et al. | |
| 2011/0148199 A1* | 6/2011 | Besore et al. .................. | 307/41 |
| 2011/0166839 A1* | 7/2011 | Smith .............................. | 703/2 |
| 2011/0208369 A1* | 8/2011 | Yang et al. .................... | 700/296 |
| 2012/0016528 A1* | 1/2012 | Raman et al. ................ | 700/291 |

FOREIGN PATENT DOCUMENTS

| | | |
|---|---|---|
| JP | 2003-240335 | 8/2003 |
| JP | 2003323239 | 11/2003 |
| JP | 2004-012148 | 1/2004 |
| JP | 2005-250734 | 9/2005 |
| JP | 2010-114967 | 5/2010 |
| JP | 2010102373 | 5/2010 |
| KR | 1020080100681 | 11/2008 |
| KR | 100968837 | 7/2010 |
| KR | 1020100075283 | 7/2010 |
| KR | 1020110002725 | 1/2011 |
| KR | 1020110012535 | 2/2011 |
| WO | WO 2009/097400 | 8/2009 |
| WO | WO 2010/074392 | 7/2010 |

OTHER PUBLICATIONS

European Search Report dated Nov. 25, 2014 issued in counterpart application No. 12774147.8-1862.
Chinese Office Action dated Feb. 15, 2016 issued in counterpart application No. 201280018917.3, 24 pages.
Japanese Office Action dated Mar. 28, 2016 issued in counterpart application No. 2014-506318, 10 pages.
Australian Examination Report No. 1 dated Jun. 24, 2016 issued in counterpart application No. 2012246932, 3 pages.
Australian Examination Report No. 2 dated Jun. 24, 2016 issued in counterpart application No. 2012246932, 4 pages.
Japanese Office Action dated Sep. 5, 2016 issued in counterpart application No. 2014-506318, 5 pages.
Korean Office Action dated Dec. 20, 2016 issued in counterpart application No. 10-2011-0036297, 9 pages.
Australian Examination Report dated Oct. 17, 2016 issued in counterpart application No. 2012246932, 4 pages.
Notice of Acceptance dated Jan. 10, 2017 issued in counterpart application No. 2012246932, 3 pages.

* cited by examiner

METHOD FOR DISPLAYING STATUS OF POWER CONSUMPTION AND PORTABLE DEVICE THEREOF

PRIORITY

This application claims priority under 35 U.S.C. §119 to a Korean Patent Application No. 10-2011-0036297, which was filed in the Korean Intellectual Property Office on Apr. 19, 2011, the entire disclosure of which is incorporated herein by reference.

BACKGROUND OF THE INVENTION

1. Field of the Invention

The present invention relates generally to displaying a status of power consumption, and more particularly, to a method for displaying the status of power consumption by providing information about power consumption at electronic appliances based on an augmented reality function and a portable device implementing the same.

2. Description of the Related Art

Around the world, various policies have been implemented and studies conducted to find ways to curb greenhouse gas emission. The efforts to curb the greenhouse gas emission include increasing electricity prices, or encouraging electricity use in a more distributed way by pricing electricity consumption depending on the time of the day the electricity is consumed.

The Real Time Pricing prices electricity consumption differently, depending on different electricity rates, and the relationship between demand and supply. Accordingly, electricity users need to know how much electricity they are using.

Until now, it has not been easy for users to obtain information about electricity consumed by electronic appliances used at home. Conventionally, residential customers obtain information regarding electricity use of electronic appliances simply by checking electricity information provided on tags of the electronic appliances or checking home meters to determine a total monthly electricity consumption.

SUMMARY OF THE INVENTION

Accordingly, the present invention has been made to solve the above-mentioned problems, and to provide at least the advantages as described below. An aspect of the present invention provides a method for determining status of electricity consumption of electronic appliances using electricity consumption information received from the electronic appliances and displaying Graphical User Interfaces (GUIs) showing different stages corresponding to the statuses of the electricity consumption, and a portable device implementing the method.

According to one aspect of the present invention, a method for displaying electricity use status is provided. At least one electronic appliance is identified in an image on a screen captured through a camera. Electricity use information of the at least one electronic appliance is received. The electricity use status of the at least one electronic appliance is determined using the received electricity use information. One of a plurality of GUIs is displayed. Each GUI corresponds to a different stage of the electricity use status of the at least one electronic appliance.

According to another aspect of the present invention, a portable device is provided. The device includes a photographing unit having a camera that captures an image of at least one electronic appliance. The device also includes a communicating unit that receives electricity use information of the at least one electronic appliance, and a GUI generating unit that generates a GUI. The device further includes a display unit, and a control unit that identifies the at least one electronic appliances in the image on a screen, determines the electricity use status of the at least one electronic appliance using the received electricity use information, and displays one of a plurality of GUIs. Each GUI corresponds to a different stage of the electricity use status of the at least one electronic appliance.

BRIEF DESCRIPTION OF THE DRAWINGS

The above and/or other aspects, features and advantages of the embodiments of the present invention will be more apparent from the following description taken in conjunction with the accompanying drawings, in which.

DETAILED DESCRIPTION OF THE EMBODIMENTS OF THE PRESENT INVENTION

Figure 1:
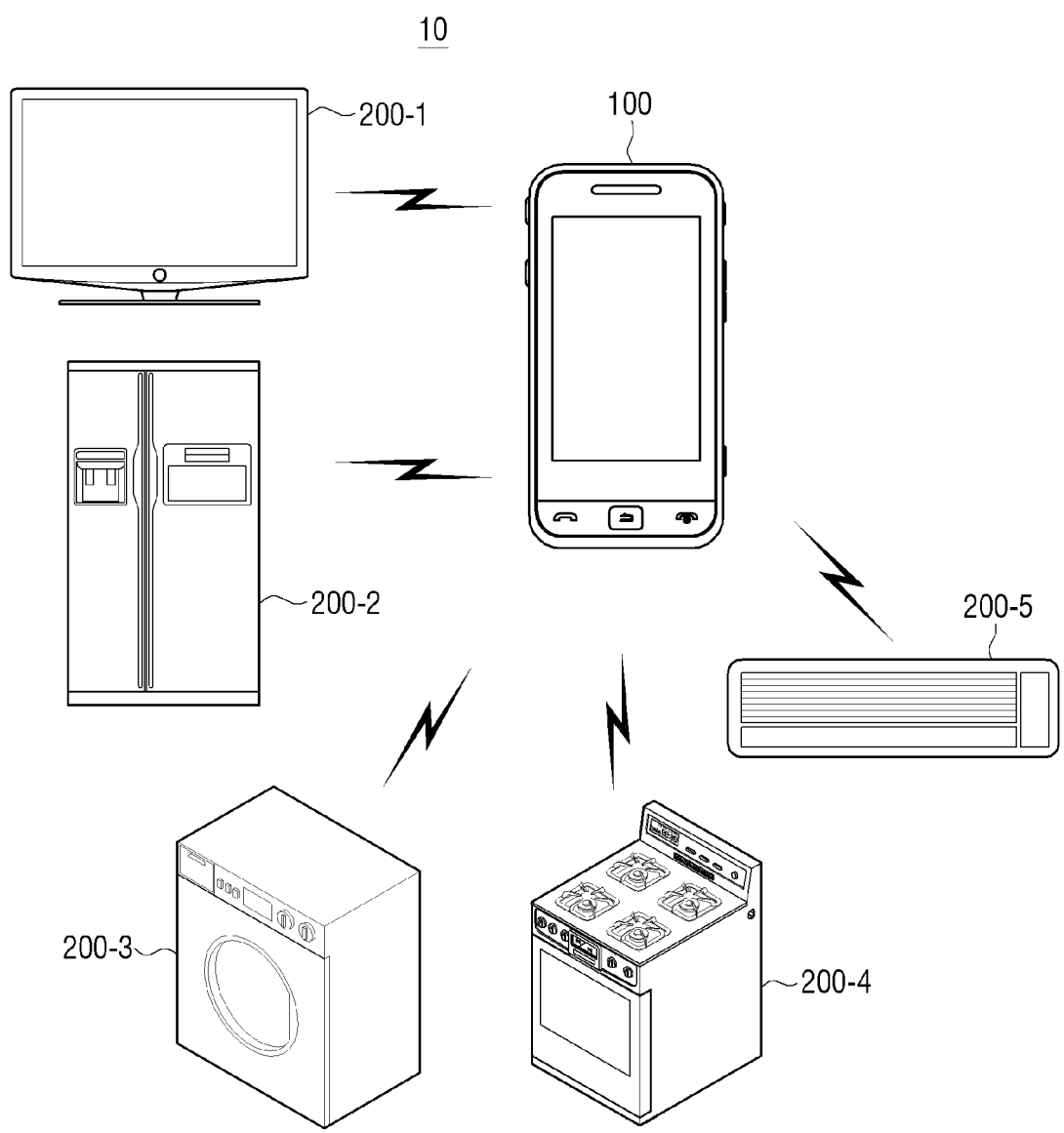
FIG. 1 is a diagram illustrating a home network system that provides a GUI containing information about a status of electricity use by an electronic appliance, according to an embodiment of the present invention.

Hereinafter, embodiments of the present invention will be described in detail with reference to the accompanying drawings.

In the following description, same or similar drawing reference numerals are used for the same or similar elements even in different drawings. The matters described in the description, such as detailed construction and elements, are provided to assist in a comprehensive understanding of the embodiments of the present invention. Accordingly, it is apparent that the embodiments of the present invention can be carried out without those specifically defined matters. Also, well-known functions or elements are not described in detail to avoid obscuring the embodiments of the present invention.

FIG. 1 is a diagram illustrating a home network system 10 to provide a GUI containing information about status of electricity use by an electronic appliance according to an embodiment of the present invention. Referring to FIG. 1, the home network system 10 may include a portable device 100 which generates a GUI to provide information about status of electricity use by the electronic appliance, and a plurality of electronic appliances 200-1 through 200-5.

The electronic appliances 200-1 through 200-5 may provide the portable device 100 with the information about electricity use thereof. Specifically, the electronic appliances 200-1 through 200-5 may provide the portable device 100 with electricity use information, which is obtained using electricity metering devices provided thereon, via mesh network. More specifically, the electronic appliances 200-1 through 200-5 may provide the electricity use information to the portable device 100 using one of Wi-fi network, Zigbee network, Near Field Communication (NFC) network and Bluetooth network. The "electricity use information" may include total electricity used so far, current electricity use, or electricity pricing information.

If the electricity metering devices are not installed on the electronic appliances 200-1 through 200-5, the electronic appliances 200-1 through 200-5 may use the Smart Meter provided externally to provide the portable device 100 with the measured electricity use information through a mesh network. The Smart Meter is an electronic electricity meter with a function to measure hourly electricity use and transmit the measured information through which users can estimate the hourly electricity costs.

The electronic appliances 200-1 through 200-5 illustrated in FIG. 1 may be implemented as TV 200-1, refrigerator 200-2, washing machine 200-3, cook top 200-4 and air conditioner 200-5, for example. However, other examples may also be implemented. For example, computers, microwaves, or electric fans may also be implemented.

The portable device 100 may photograph the plurality of electronic appliances 200-1 through 200-5 using a camera, and identify the electronic appliances 200-1 through 200-5, respectively. That is, the portable device 100 may identify the electronic appliances 200-1 through 200-5 using previously stored location or shape information of the electronic appliances 200-1 through 200-5. The method for the portable device 100 to identify the electronic appliances 200-1 through 200-5 based on the photographed images will be explained in detail below with reference to FIGS. 14A to 14F.

The portable device 100 may receive electricity use information of the identified electronic appliances 200-1 through 200-5 through a mesh network, such as, Wi-fi network, Zigbee network, NFC network, Bluetooth network, etc.

The portable device 100 then determines the electricity use status of the plurality of electronic appliances 200-1 through 200-5 using the received electricity use information of the electronic appliances 200-1 through 200-5, and displays different GUI corresponding to respective stages of electricity use status.

Specifically, the portable device 100 may determine if the current electricity use exceeds a target use, if the current pattern of using electronic appliances would lead to exceeding the target use, or if electricity use at this moment is relatively higher when considering the electricity pricing at the current time of the day, to thereby determine the electricity use status of the plurality of electronic appliances 200-1 through 200-5.

Herein, the portable device 100 may display a GUI, which is generated using augmented reality function, on a screen. Specifically, the portable device 100 may display images including the electronic appliances 200-1 through 200-5 on the screen, and display the GUI matching the electricity use status of the electronic appliances 200-1 through 200-5 at locations at which the images of the electronic appliances 200-1 through 200-5 are displayed.

For example, the portable device 100 may determine the electricity use status of the plurality of electronic appliances 200-1 through 200-5 into three stages of "good," 'ok', and "bad," and generate a GUI wherein the corresponding electronic appliances are in different colors corresponding to the respective stages of the electricity use status. In another embodiment, the portable device 100 may generate icons corresponding to the respective stages of the electricity use status of the electronic appliances 200-1 through 200-5 and display the generated icons around the corresponding electronic appliances 200-1 through 200-5 in the image.

Further, if the generated GUI is selected through a user input unit (e.g., touch panel), the portable device 100 may generate a menu window containing information about the electricity use of the corresponding electronic appliances and a menu through which it is enabled to control the electricity use of the electronic appliance.

In one embodiment, the portable device 100 may be implemented as a smartphone, but not limited thereto. Accordingly, in other embodiments, the portable device 100 may be implemented as a tablet PC having a photographing unit and a display unit, a digital camera, or a digital camcorder.

Through the home network system 10 explained above, the user is able to check intuitively the electricity use status of the electronic appliances at home and accordingly control the electronic appliances according to the electricity use status.

Figure 2:
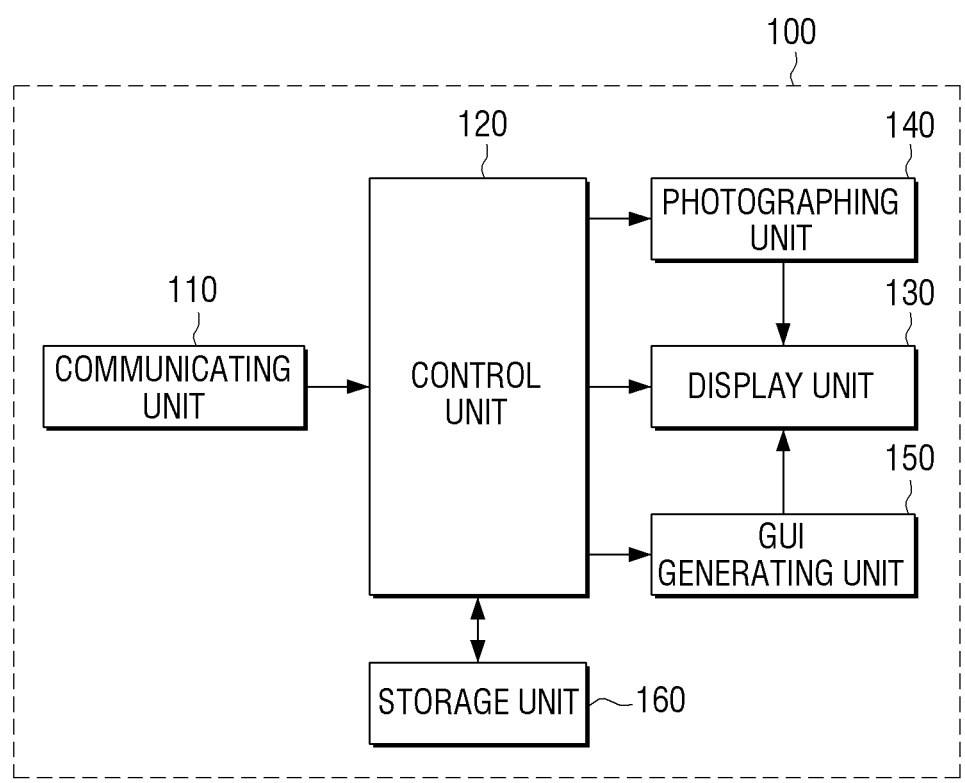
FIG. 2 is a block diagram of a portable device, according to an embodiment of the present invention.

The portable device 100, according to an embodiment of the present invention, is explained in detail below with reference to FIG. 2. FIG. 2 is a block diagram of the portable device 100 according to an embodiment of the present invention. Referring to FIG. 2, the portable device 100 may include a communicating unit 110, a control unit 120, a display unit 130, a photographing unit 140, a GUI generating unit 150 and a storage unit 160.

The communicating unit 110 may receive electricity use information of the plurality of external electronic appliances 200-1 through 200-5. Herein, the electronic use information may include the total electricity use so far, current electricity use, electricity pricing information, or monthly target electricity use.

Further, the communicating unit 110 may receive the electricity use information directly from the plurality of external electronic appliances 200-1 through 200-5, but not limited thereto. Accordingly, in another embodiment, the communicating unit 110 may receive the electricity use information of the plurality of electronic appliances 200-1 through 200-5 from an external Demand Response (DR) controller. This is explained below with reference to FIG. 13. Further, the communicating unit 100 may receive from the DR controller information about the electricity pricing at the current time of the day.

Further, the photographing unit 140 may provide photographed images, in which case the communicating unit 110 may receive electricity use information of at least one electronic appliance identified on the images inputted from the photographing unit 140, and receive the electricity use information of all the electronic appliances 200-1 through 200-5 at a preset cycle.

The communicating unit 110 may receive the electricity use information from the plurality of electronic appliances 200-1 through 200-5 and the DR controller through one of Wi-fi network, Zigbee network, NFC network and Bluetooth network. Among these, Zigbee network, which is near-field wireless individual communication network, may be applied as low-electricity and low-price home network system 10.

The display unit 130 may display images photographed through the photographing unit 140 or images stored at the storage unit 160. Further, the display unit 130 may display the GUI generated at the GUI generating unit 150.

The photographing unit 140 may photograph images about the plurality of electronic appliances 200-1 through 200-5. Specifically, using a camera, the photographing unit 140 focuses an image on an image sensor area where the image sensor photo electrically converts the light entered through a lens into an electric signal. The image processing unit (not illustrated) provided in the photographing unit 140 performs signal processing with respect to images inputted from the image sensor to thus acquire image data. The image data is displayed at the display unit 130.

The GUI generating unit 150 generates GUI indicating information about electricity use status of the plurality of electronic appliances 200-1 through 200-5. Further, the GUI generating unit 150 may generate a menu window including information about the electricity use of the electronic appliances 200-1 through 200-5 and a menu to control the electricity use of a corresponding electronic appliance.

The storage unit 160 may store externally-inputted images or photographed images. Further, the storage unit 160 may include at least one of location information and shape information of the plurality of electronic appliances 200-1 through 200-5. The storage unit 170 may be implemented as a hard disk, or nonvolatile memory.

The control unit 120 may analyze a user command based on the user's manipulation as delivered through a user input and control the overall operation of the portable device 100 according to the analyzed user command.

Specifically, the control unit 120 may identify at least one of the plurality of electronic appliances 200-1 through 200-5 on a screen inputted through the photographing unit 140. Herein, the control unit 120 may identify at least one electronic appliance from among the plurality of electronic appliances 200-1 through 200-5 using the shape information or location information of the plurality of electronic appliances 200-1 through 200-5 stored at the storage unit 160. The method for storing the shape information or location information of the electronic appliances and identifying the electronic appliances using such information is explained below with reference to FIGS. 14A to 14F.

Figure 14A:
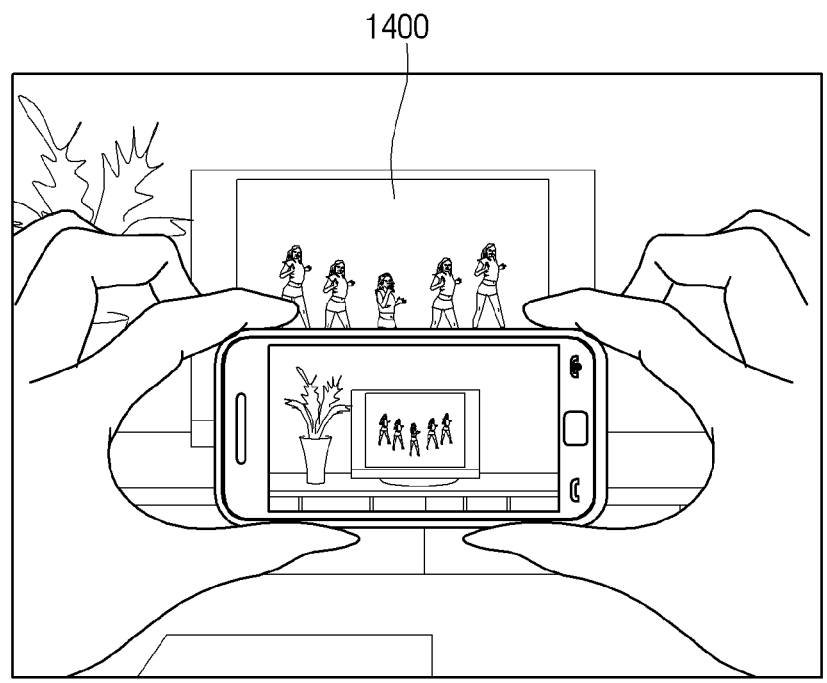
FIGS. 14A to 14F are diagrams provided to illustrate a method for storing information about locations and shapes of electronic appliances, according to an embodiment of the present invention.
Figure 14B:
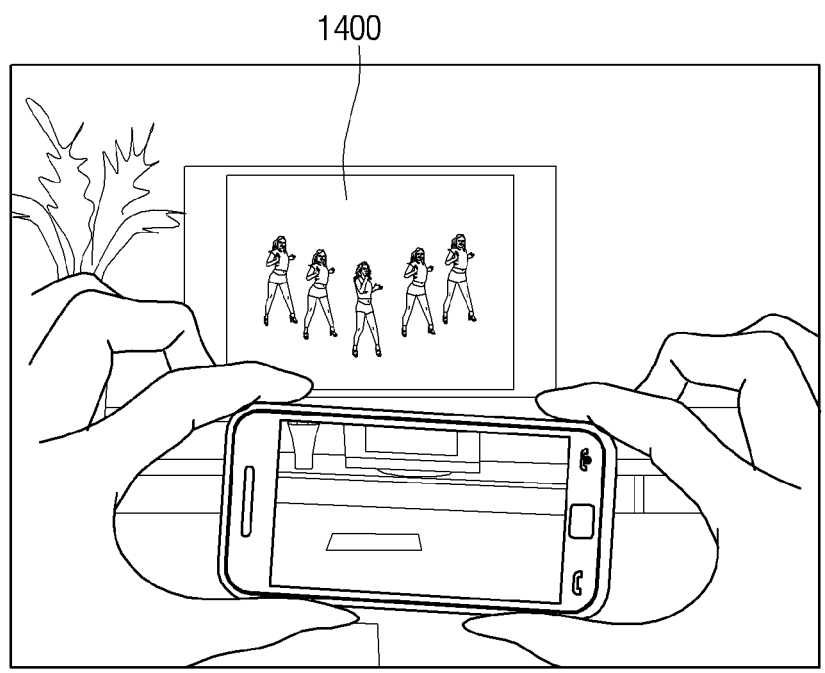
Figure 14C:
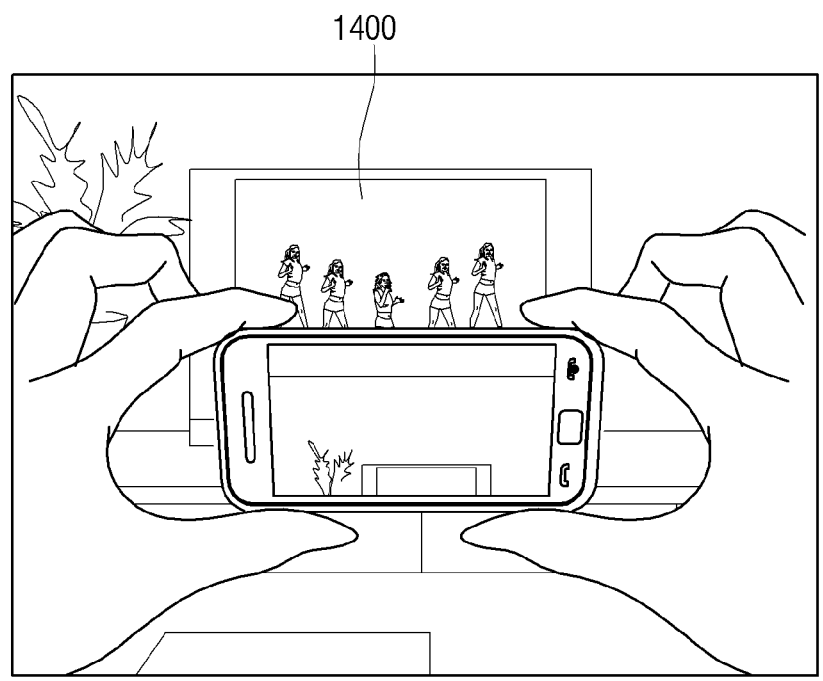
Figure 14D:
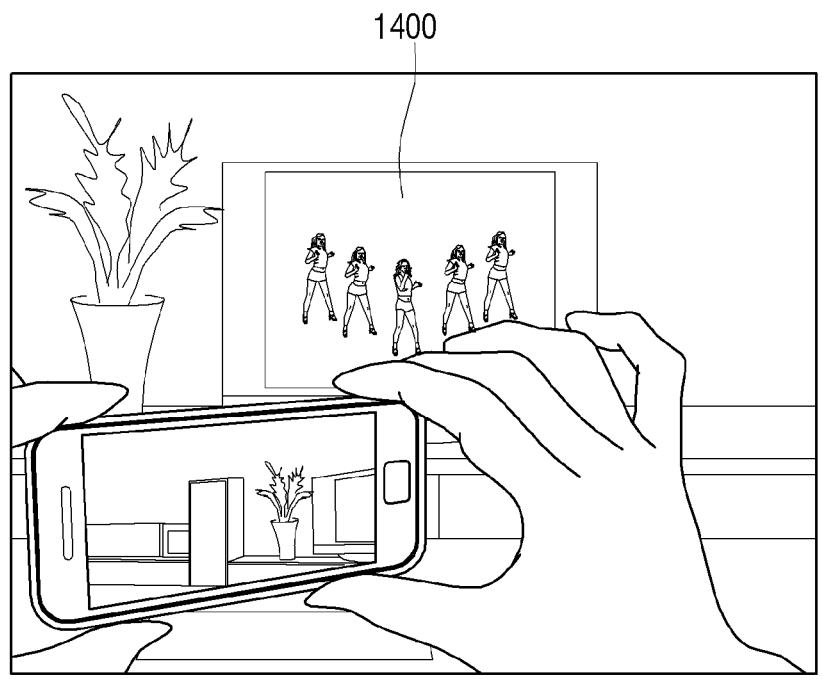
Figure 14E:
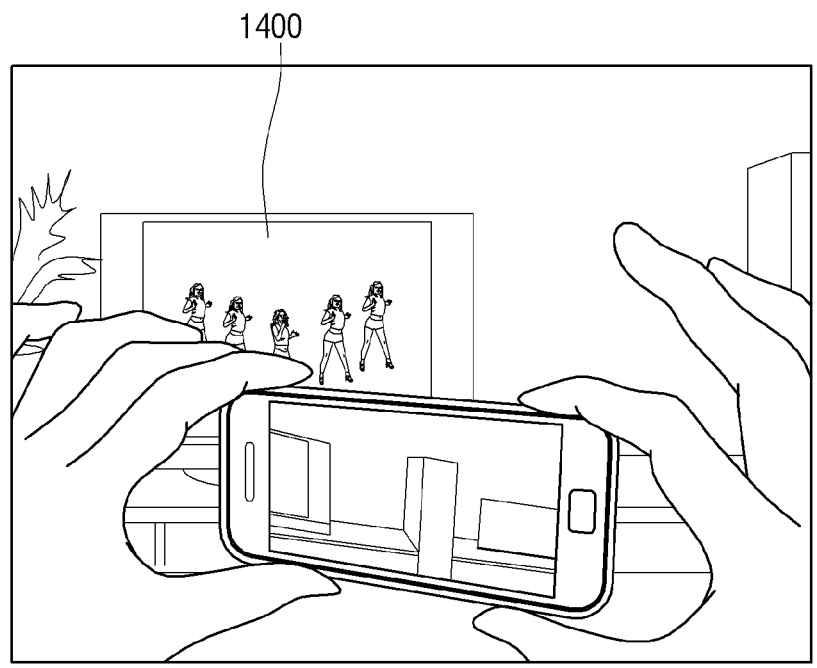

Referring to FIG. 14A, the user may photograph the TV 1400 in a front direction using the portable device 100. Referring to FIGS. 14B to 14E, the user may then photograph locations respectively at lower, upper, and right and left directions to the TV 1400. By doing so, the portable device 100 is enabled to store upper/lower/left/right images of the TV 1400 using an azimuth sensor and thus store relative location of the TV 1400.

Figure 14F:
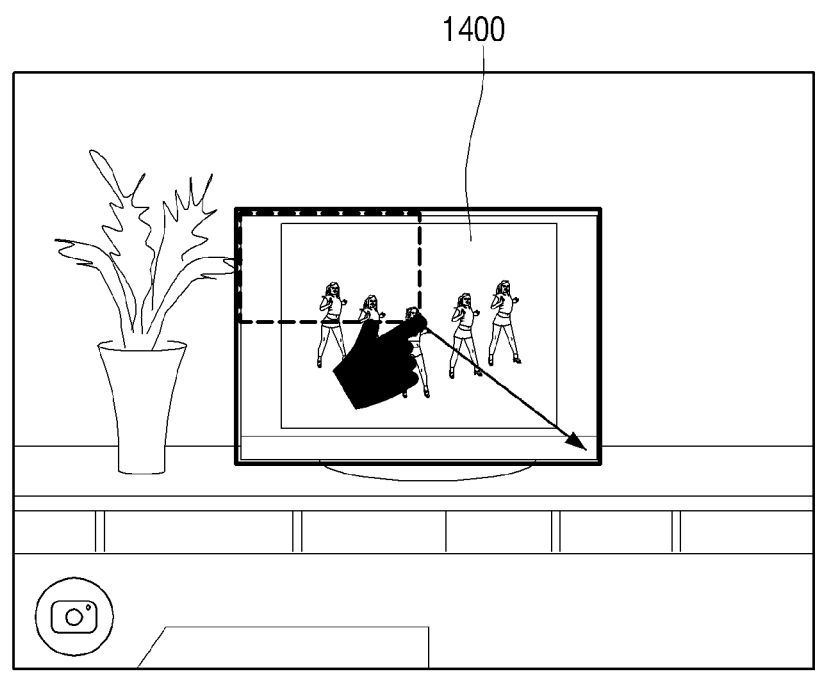

Referring to FIG. 14F, the user may then drag the TV 1400 in the image photographed through the portable device 100 to store the shape of the TV 1400.

As explained above, the control unit 120 may track the previously-stored location and shape information of the TV 1400 based on the currently-photographed image, using previously-stored (relative) location and shape information of the TV 1400. If the tracking reveals that there is TV 1400 matching the previously-stored location and shape information of the TV 1400, the control unit 120 identifies the TV 1400 in the currently-photographed image.

Identifying an electronic appliance based on the shape or location information thereof is explained by way of an example. That is, another method may appropriately be implemented to identify the electronic appliances. For example, the control unit 120 may identify a corresponding electronic appliance using QR code attached to the electronic appliance.

Further, the control unit 120 may determine electricity use status of the plurality of electronic appliances 200-1 through 200-5 using the electricity use information of the electronic appliances 200-1 through 200-5 received through the mesh network, and display different GUIs corresponding to respective stages of the electricity use status.

Specifically, the control unit 120 may determine if the current electricity use exceeds a target use, if the current pattern of using electronic appliances would lead to exceeding the target use, or if electricity use at this moment is relatively higher when considering the electricity pricing at the current time of the day, to thereby determine the electricity use status of the plurality of electronic appliances 200-1 through 200-5. The control unit 120 may determine the electricity use status of the plurality of electronic appliances 200-1 through 200-5 into three stages, i.e., stage 1 (meaning "good"), stage 2 (meaning "normal"), and stage 3 (meaning "bad").

For example, the control unit 120 may determine the electricity use status of the electronic appliance using information as to whether the current electricity use exceeds the target use. Accordingly, if the air conditioner is currently using 50% of target electricity use, that is, if the air conditioner is currently using electricity below 15 KW and the target use thereof is 30 KW, the control unit 120 determines the air conditioner to be in stage 1 electricity use status. If the air conditioner is currently using more than 50% (e.g., 15 KW) of the target use (e.g., 30 KW), but below the target use, the control unit 120 determines the electricity use status of the air conditioner to be on stage 2. If the current electricity use of the air conditioner exceeds the target use (e.g., 30 KW), the control unit 120 determines the electricity use status of the air conditioner to be on stage 3. The electricity use status is thus less desirable as the stage is closer to stage 3.

In another embodiment, the control unit 120 may determine the electricity use status of the electronic appliance using information as to if the current pattern of using electronic appliances would lead to exceeding the target use. That is, the control unit 120 may determine the TV on stage 1 of the electricity use status, if the current pattern of using TV is expected to use less than 80% of the target use. If the current TV use pattern is expected to use more than 80% of the target use, but below the target use, the control unit 120 determines the TV to be on stage 2 of the electricity use status. If the current TV use pattern is expected to exceed the target use, the control unit 120 determines the TV on stage 3 of the electricity use status.

In yet another embodiment, the control unit 120 may determine the electricity use status of the electronic appliance using information as to if electricity use at this moment is relatively higher when considering the electricity pricing at the current time of the day. That is, the control unit 120 may determine the stage of the current electricity pricing based on four stages (e.g., stage 1: very cheap, stage 2: slightly cheap, stage 3: slightly expensive, stage 4: very expensive), and determine the stage of electricity use of the TV based on four stages (e.g., stage 1: power mode, stage 2: normal mode, stage 3: power-save mode, stage 4: lowest power use mode). Accordingly, if the TV is on stage 4 (i.e., "lowest power use mode"), while the current electricity pricing is on stage 4 (i.e., "very expensive"), the control unit 120 determines the electricity use status of the TV to be on stage 1. If the TV is on electricity use stage 3 (i.e., "power-save mode"), the control unit 120 determines the TV to be on stage 2 of the electricity use status, and if the TV is on stage 1 (i.e., "power mode"), or stage 2 (i.e., "normal mode"), the control unit 120 determines the TV to be on stage 3 of the electricity use status. The control unit 120 determines the TV to be on stage 1 of the electricity use status irrespective of electricity use stages of the TV, if the current electricity pricing is on stage 1 (i.e., "very cheap"). Accordingly, the electricity use status of the electronic appliance can be determined based on the electricity use compared to the electricity pricing at the current time of the day.

Some values mentioned above are used only for illustrative purposes. Accordingly, the respective stages may be set using different values.

Further, the specific method for determining electricity use status of the electronic appliances is explained above only for illustrative purpose. That is, electricity use status may be determined based on other methods.

Further, the control unit 100 may display the generated GUI on a screen using Augmented Reality (AR) function. Specifically, the control unit 120 may display an image including a plurality of electronic appliances 200-1 through 200-5, and display GUI corresponding to the electricity use status of the identified electronic appliance at a location where the identified electronic appliance is displayed. Herein, the control unit 120 may generate a GUI in which a corresponding electronic appliance is colored differently, wherein the color corresponds to each stage of the electricity use status, as explained in detail below, with reference to FIGS. 3 to 8.

Figure 3:
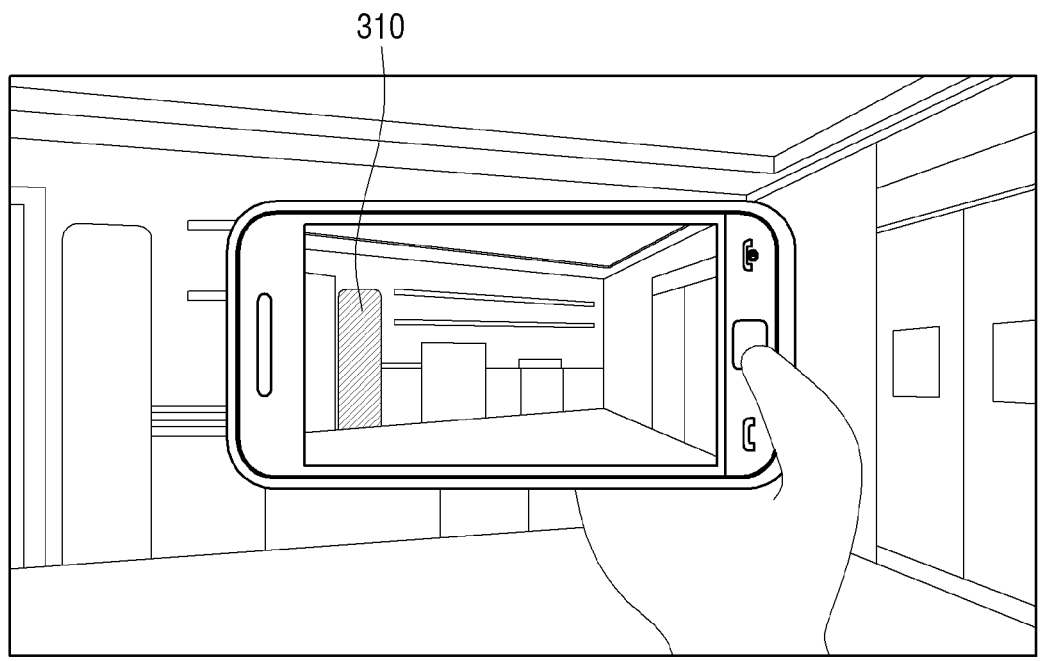
FIGS. 3 to 10 are diagrams illustrating GUIs displayed on a portable device, according to an embodiment of the present invention.
Figure 4:
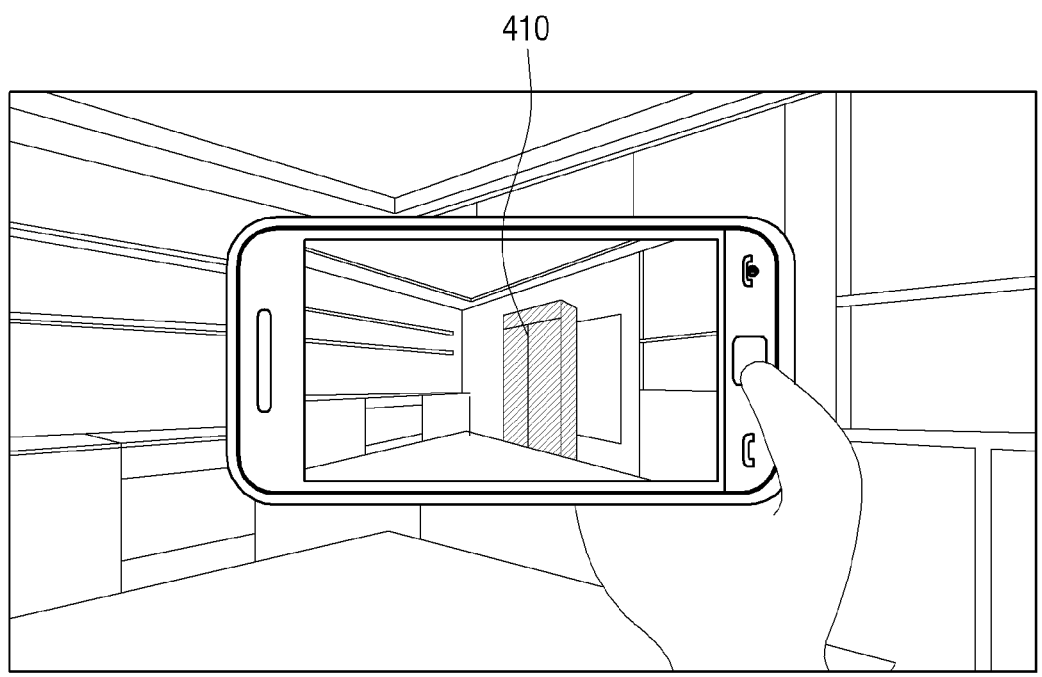
Figure 5:
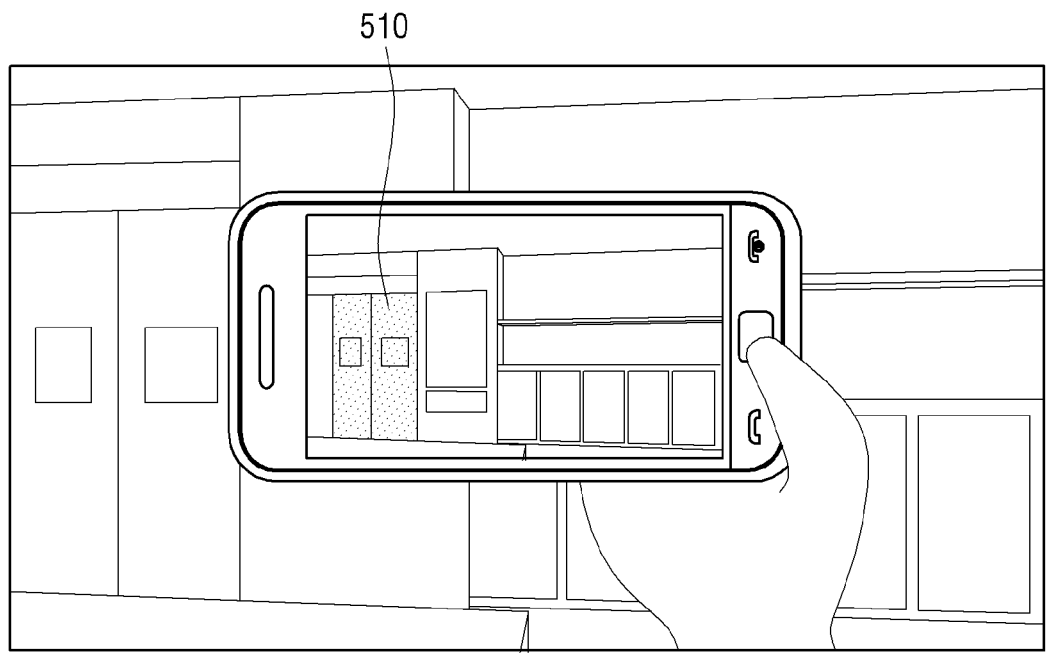
Figure 6:
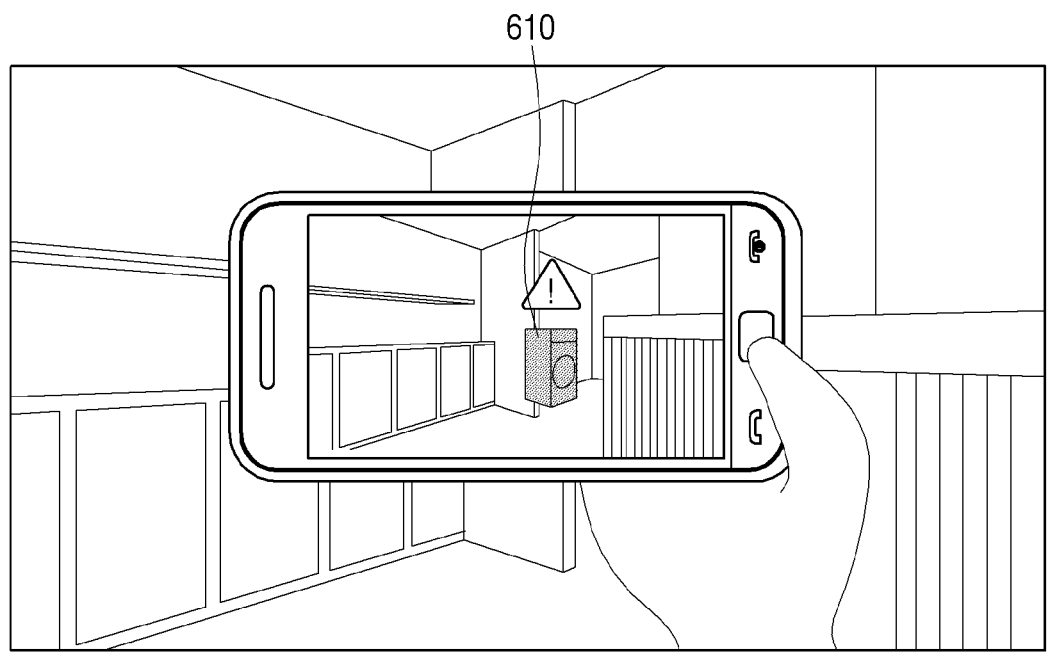

Specifically, if the air conditioner is determined to be on stage 1 of the electricity use status, referring to FIG. 3, the control unit 120 may add a GUI 310 in which the air conditioner included in the image is colored in color 1. For instance, color 1 may be green. If a refrigerator is determined to be on stage 2 of electricity use status, referring to FIG. 5, the control unit 120 may add a GUI 510 in which the refrigerator included in the image is colored in color 2. For instance, color 2 may be yellow. If a washing machine is determined to be on stage 3 of electricity use status, referring to FIG. 6, the control unit 120 may add a GUI 610 in which the washing machine included in the image is colored in color 3. For instance, color 3 may be red.

While the electronic appliances are explained as being colored in color 1 (green), color 2 (yellow) and color 3 (red), for illustrative purpose and the stages may be represented using other colors.

Further, the control unit 120 may generate icons corresponding to the respective stages of the electricity use status of the electronic appliance and display the generated icon in the proximity to the corresponding electronic appliance on the image.

Figure 7:
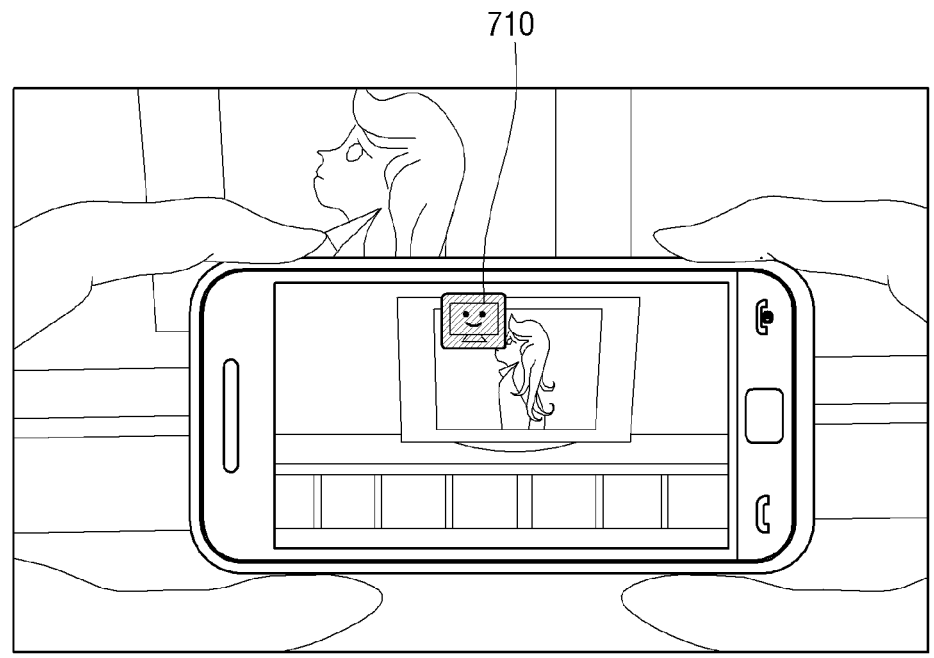
Figure 8:
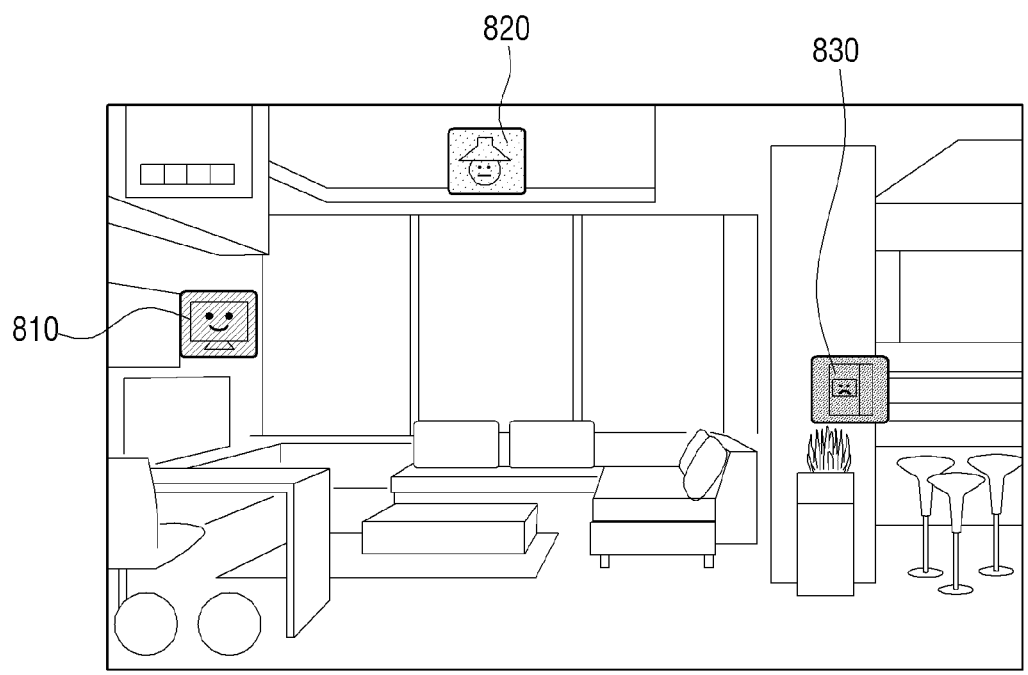

For instance, if TV is determined to be on stage 1 of electricity use status, referring to FIGS. 7 and 8, the control unit 120 may display happy-face icons 710, 810. If lighting is determined to be on stage 2 of electricity use status, referring to FIG. 8, the control unit 120 may display straight-face icon 820. If refrigerator is determined to be on stage 3 of electricity use status, referring to FIG. 8, the control unit 120 may display unhappy-face icon 830.

However, the above-explained icons are only for illustrate purpose. Accordingly, other icons may be adequately used.

As explained above, since the electronic appliances are represented by different colors or icons corresponding to the electricity use status thereof, users are able to determine the electricity use status of the electronic appliances more intuitively.

Further, if the generated GUI is selected through the user input (e.g., touch panel), the control unit 120 may generate a menu window including information about the electricity use of a corresponding electronic appliance and a menu to control the electricity use of the corresponding electronic appliance.

Figure 9:
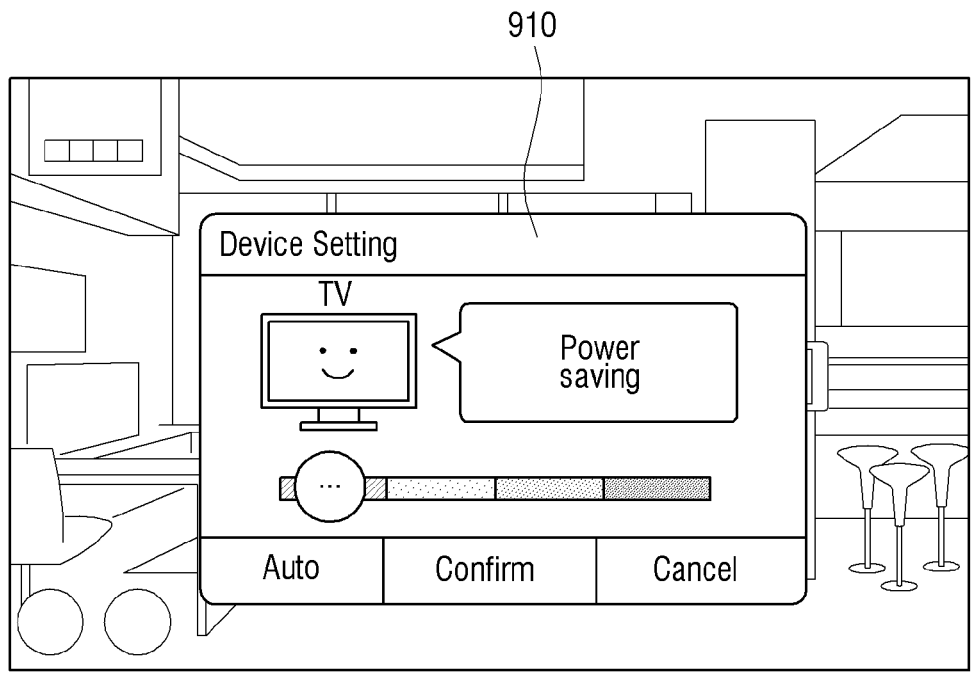

For instance, if the icon 810 expressing the electricity use status of the TV is selected (FIG. 8), the menu window 910, 1010 (FIG. 9 or FIG. 10) may be displayed. The menu window 910 of FIG. 9 is to control the electricity use of the TV, through the status adjustment bar included in the menu window 910. That is, if a command is inputted through the status adjustment bar to increase the electricity use, the control unit 120 may transmit the control command to the TV via the communicating unit 110. The menu window 1010 of FIG. 10 is to provide information about the current electricity use, in which information about the total electricity used so far, current electricity use, or total cost for the electricity used so far.

Figure 10:
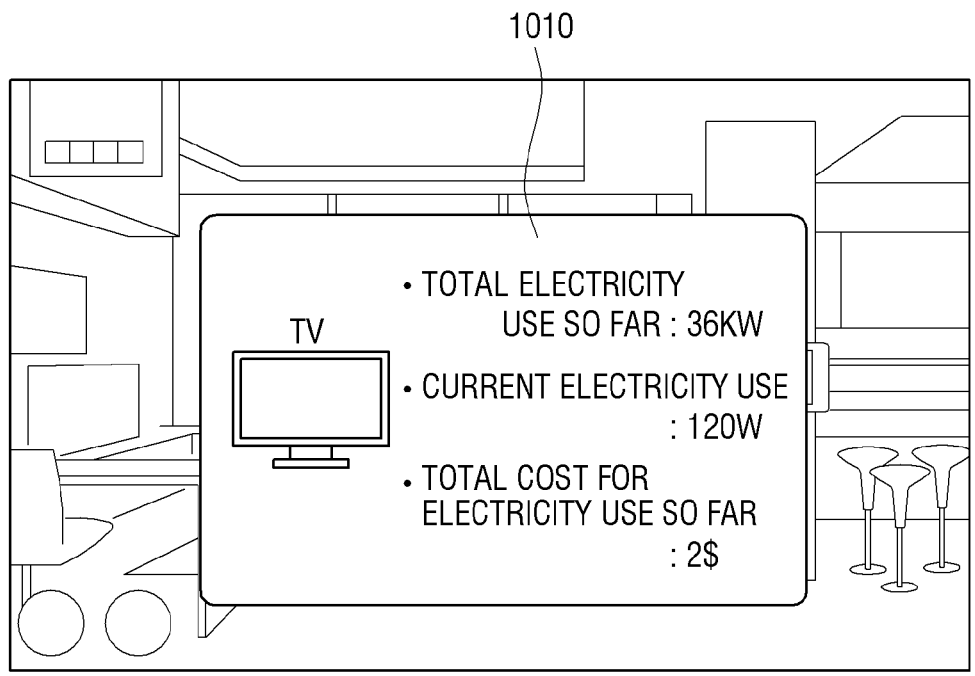

Accordingly, the user is able to not only check the electricity use status of the electronic appliances, but also control the electricity use of the electronic appliances more efficiently, through the use of the menu windows as the ones illustrated in FIGS. 9 and 10.

Figure 11:
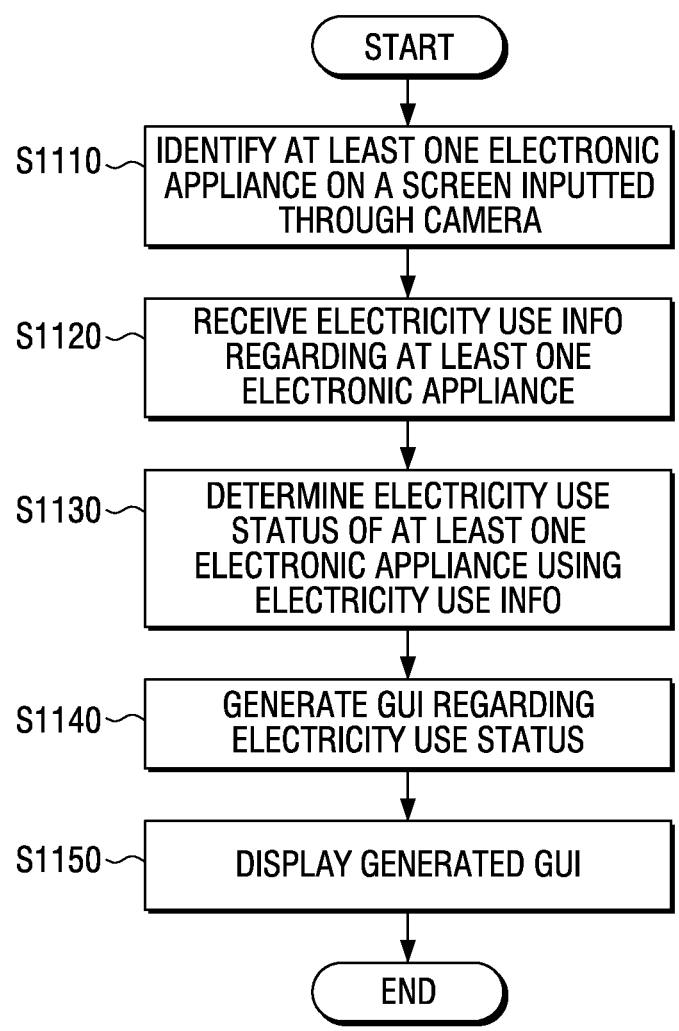
FIG. 11 is a flowchart illustrating a method for displaying a status of electricity consumption on a portable device to thereby provide information about the status of electricity use by the electronic appliance, according to an embodiment of the present invention.

A method for generating a GUI of the portable device 100 to provide information about electricity use status of the electronic appliance will be explained below with reference to FIGS. 11 and 12. FIG. 11 is a flowchart provided to explain briefly the method for the portable device to display electricity use status of the electronic appliances, according to en embodiment.

In step S1110, the portable device 100 identifies at least one electronic appliance in a screen inputted by the camera. Herein, the portable device 100 may identify at least one electronic appliance using previously-stored location or shape information of the at least one electronic appliance.

In step S1120, the portable device 100 receives electricity use information of the identified electronic appliance. Herein, the portable device 100 may receive the electricity use information of the identified electronic appliance using one of Wi-fi network, Zigbee network, NFC network and Bluetooth network. It should be appreciated that the example of receiving electricity use information of the identified electronic appliance through network is written only for illustrative purpose. Accordingly, other examples are possible. For example, the electricity use information of the electronic appliance may be received at a preset cycle before the electronic appliance is photographed by the camera.

In step S1130, the portable device 100 determines electricity use status of at least one electronic appliance using the received electricity use information. Herein, the portable device 100 may determine if the current electricity use exceeds a target use, if the current pattern of using electronic appliances would lead to exceeding the target use, or if electricity use at this moment is relatively higher when considering the electricity pricing at the current time of the day, to thereby determine the electricity use status of at least one electronic appliances. The portable device 100 may determine the electricity use status of at least one electronic appliance into a plurality of stages.

In step S1140, the portable device 100 generates a GUI regarding the electricity use status. The generated GUI may implement colors or icons to represent each stage of electricity use status of the corresponding electronic appliances.

In step S1150, the portable device 100 displays the generated GUI. The portable device 100 may particularly display the generated GUI using augmented reality (AR) function. That is, the portable device 100 may display an image including at least one electronic appliance, and display a GUI corresponding to the electricity use status of the identified electronic appliance at a location where the identified electronic appliance is displayed.

Figure 12:
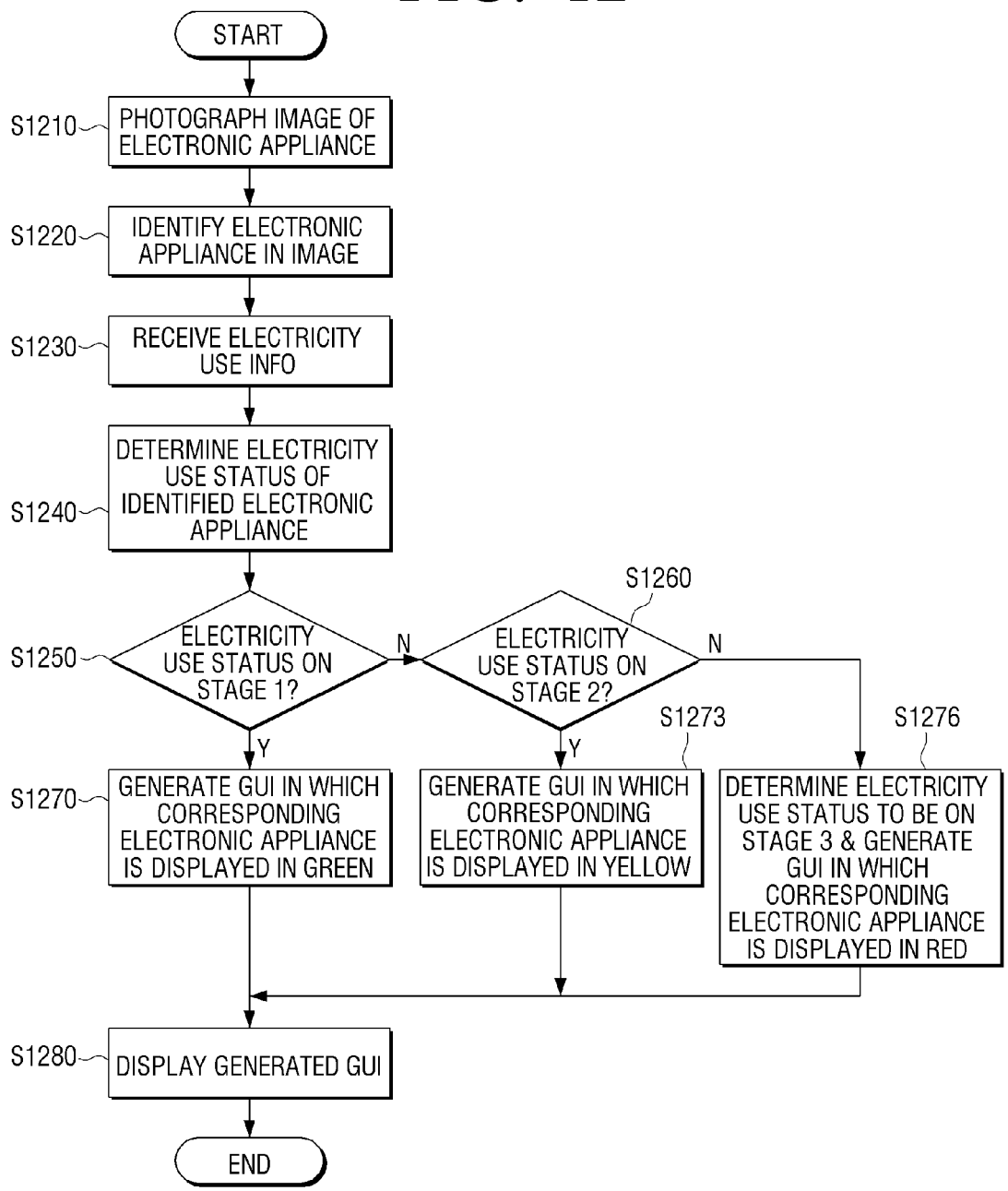
FIG. 12 is a flowchart illustrating a method for displaying a status of electricity use on a portable device to thereby provide information about the status of electricity use by the electronic appliance, according to an embodiment of the present invention.

FIG. 12 is a flowchart provided to explain in detail the method for the portable device to display electricity use status of the electronic appliances, according to an embodiment of the present invention.

First, in step S1210, the portable device 100 photographs an image including an electronic appliance through the photographing unit 160. The photographed image may include one, or a plurality of electronic appliances.

In step S1220, the portable device 100 identifies the electronic appliance in the image. Herein, the portable device 100 may identify the electronic appliance using shape or location information of the electronic appliance.

In step S1230, the portable device 100 receives electricity use information of the identified electronic appliance. The portable device 100 may receive the electricity use information of the identified electronic appliance using one of Wi-fi network, Zigbee network, NFC network and Bluetooth network.

In step S1240, if the electricity use information of the identified electronic appliance is received, the portable device 100 determines the electricity use status of the identified electronic appliance. Herein, as explained above, the portable device 100 may determine the electricity use status of a corresponding electronic appliance using various methods. The portable device 100 may determine the electricity use status of at least one electronic appliance into stage 1 ("good"), stage 2 ("ok"), and stage 3 ("bad").

In step S1250, the portable device 100 determines if the electricity use status of the identified electronic appliance is on stage 1. In step S1250-Y, if the identified electronic appliance is determined to be on stage 1, in step S1270, the portable device 100 generates a GUI in which the corresponding electronic appliance in the image is colored in green color.

In step S1250-N, if the electricity use status of the identified electronic appliance is other than stage 1, in step S1260, the portable device 100 determines if the identified electronic appliance is on stage 2. In step S1260-Y, if the identified electronic appliance is on stage 2, in step S1273, the portable device 100 generates a GUI in which the corresponding electronic appliance in the image is colored in yellow color.

At 1260-N, if the identified electronic appliance is not on stage 2, in step S1276, the portable device 100 determines that the corresponding electronic appliance is on stage 3, and accordingly generates a GUI in which the corresponding electronic appliance is colored in red color.

In step S1280, the portable device 100 displays the GUI generated in step S1270, S1273, and S1276.

With the methods explained above with reference to FIGS. 11 and 12, the users are able to check the electricity use status of the electronic appliances at home.

Figure 13:
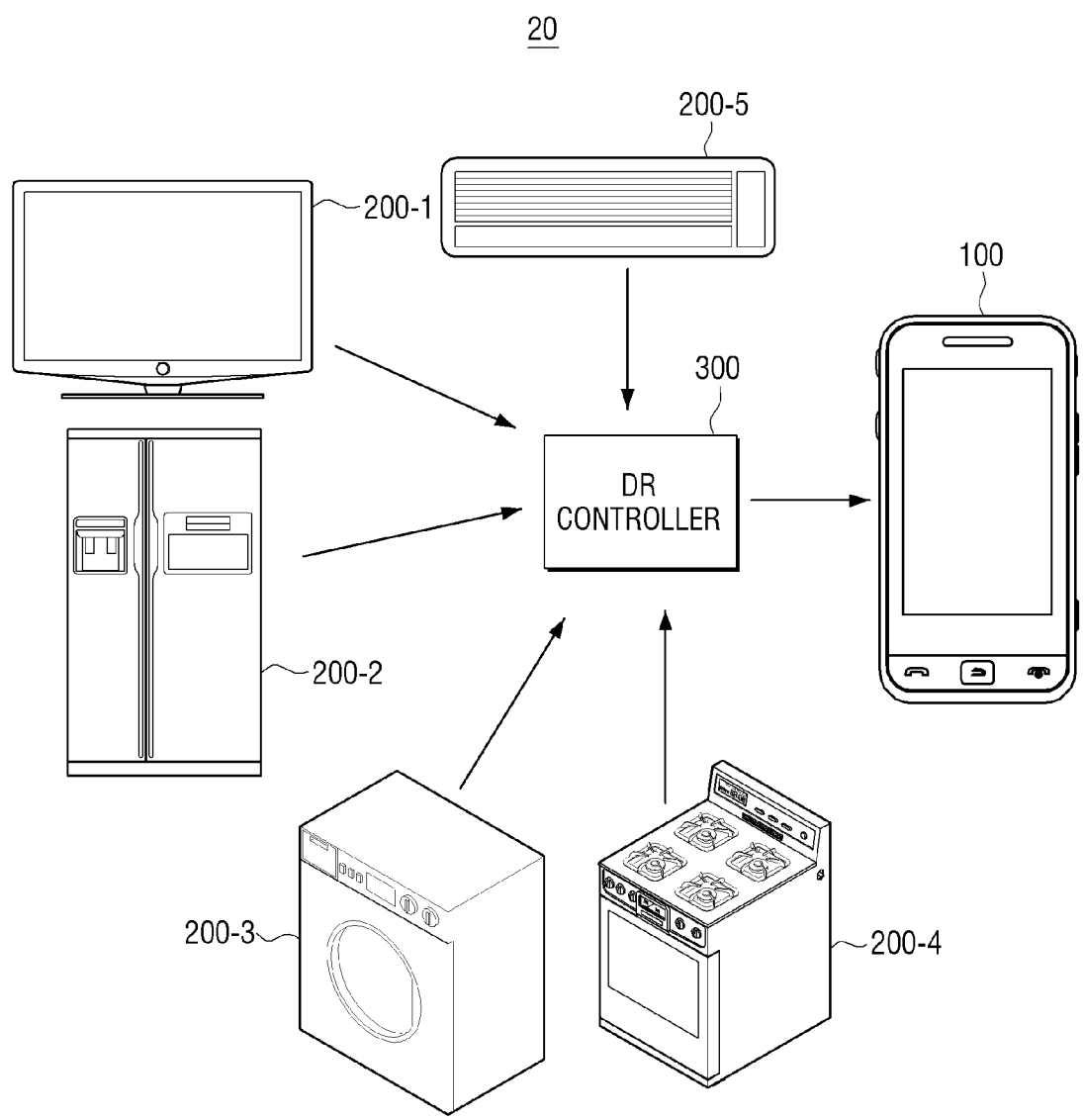
FIG. 13 is a diagram illustrating a home network system that provides a GUI containing information about a status of electricity use by the electronic appliance, according to another embodiment of the present invention.

Below, the method of receiving electricity use information using DR controller will be explained. FIG. 13 illustrates a home network system to provide GUI that includes information about electricity use status of the electronic appliances, according to another embodiment.

Referring to FIG. 13, the home network system 20 may include a demand response (DR) controller 300, in addition to the components of the home network system 10 illustrated in FIG. 1.

The DR controller 300 controls the power of the electronic appliances to manage electricity use more efficiently. That is, the DR controller 300 controls so that the electronic appliances run on lower electricity if the electricity demand is at peak or electricity price is at the highest level, and run on higher electricity if demand for electricity is low or electricity price is at the lowest level. For instance, in terms of heating/cooling control, the DR controller 300 may adjust the temperature of the room according to the electricity pricing.

Referring to FIG. 13, the DR controller 300 receives electricity use information about the plurality of electronic appliances 200-1 through 200-5 from the electronic appliances 200-1 through 200-5. The DR controller 300 then sends the received electricity use information to the portable device 100. Herein, the DR controller 300 may send not only the electricity use information of the plurality of electronic appliances 200-1 through 200-5, but also additional control information such as current electricity pricing, or the like.

Accordingly, the portable device 100 provides GUI in the manner explained above with reference to FIGS. 2 to 12 using the electricity use information and additional control information of the plurality of electronic appliances 200-1 through 200-5 received from the DR controller 300.

Although, in the embodiments explained above, the electricity use status of the identified electronic appliance is expressed in GUI in the image photographed through the camera, other examples are possible. For example, still image previously stored at the storage unit 160 may be used, in which the electricity use status of the plurality of electronic appliances 200-1 through 200-5 contained in the previously-stored still image is determined and represented as a GUI. Specifically, referring to FIG. 8, the portable device 100 may store still image of a living room beforehand, and display an icon corresponding to the electricity use status at a previously-stored location.

Additionally, the electricity use status of the electronic appliances above is described in three stages, for illustrative purposes and the electricity use status of the electronic appliances may be represented using two or more stages.

Further, although the electricity use status of the electronic appliances is expressed by colors or icons for illustrative purposes, the electricity use status of the electronic appliances may also be expressed in another manner.

The foregoing embodiments and advantages of the present invention are not to be construed as limiting the present invention. The present invention can be readily applied to other types of apparatuses. Accordingly, it will be understood by those skilled in the art that various changes in form and detail may be made therein without departing from the spirit and scope of the present invention as defined by the appended claims.

What is claimed is:

1. A method for displaying electricity use status, comprising the steps of:
   identifying an electronic appliance from among a plurality of electronic appliances in an image on a screen captured through a camera, the electronic appliance being identified using at least one of a relative location of the electronic appliance to locations of other electronic appliances among the plurality of electronic appliances and a stored shape of the electronic appliance;

receiving electricity use information of the electronic appliance identified in the image;

determining the electricity use status of the electronic appliance using the received electricity use information;

displaying one of a plurality of Graphical User Interfaces (GUI), wherein each of the plurality of GUIs corresponds to a different stage of the electricity use status of the electronic appliance;

generating, when the displayed one of the GUIs is selected, a menu window including information about electricity use of the electronic appliance corresponding to the selected GUI and a menu to control the electricity use of the electronic appliance corresponding to the selected GUI; and transmitting a control command to control the electricity use of the electronic appliance to the electronic appliance, wherein displaying the one of the plurality of GUIs comprises matching a GUI that corresponds to the electricity use status of the electronic appliance to an area of the screen where the electronic appliance is displayed and displaying the GUI.

2. The method of claim 1, further comprising storing at least one of location information and shape information of the electronic appliance.

3. The method of claim 2, wherein identifying the electronic appliance comprises identifying the electronic appliance using at least one of the stored location and shape information of the electronic appliance.

4. The method of claim 1, wherein the one of the plurality of GUIs attributes one of a plurality of different colors to the electronic appliance, wherein each of the plurality of colors corresponds to a different stage of the electricity use status.

5. The method of claim 1, wherein the one of the plurality of GUIs displays the electronic appliance using one of a plurality of icons, wherein each of the plurality of icons corresponds to a different stage of the electricity use status.

6. The method of claim 1, wherein determining the electricity use status comprises determining whether the current electricity use of the electronic appliance exceeds a target use or whether a current pattern of using the electronic appliance will lead to exceeding the target use.

7. The method of claim 1, further comprising receiving information about electricity pricing at a current time of day, and wherein determining the electricity use status comprises determining whether electricity use at a current moment is relatively high based on the electricity pricing at the current time of the day.

8. The method of claim 1, wherein receiving the electricity use information uses one of a Wi-fi network, a Zigbee network, an NFC network, and a Bluetooth network.

9. The method of claim 1, wherein the electricity use information comprises at least one of a total electricity used so far, a current electricity use, and electricity pricing information regarding the electronic appliance.

10. A portable device comprising:
a camera that captures an image of an electronic appliance;
a transceiver that receives electricity use information of the electronic appliance;
a display that displays the image of the electronic appliance on a screen captured through the camera; and
a controller that identifies the electronic appliance from among a plurality of electronic appliances in the image on the screen, the electronic appliance being identified using at least one of a relative location of the electronic appliance to locations of other electronic appliances among the plurality of electronic appliances and a stored shape of the electronic appliance, determines the electricity use status of the electronic appliance using the received electricity use information, and displays one of a plurality of Graphical User Interfaces (GUIs), wherein each of the plurality of GUIs corresponds to a different stage of the electricity use status of the electronic appliance, wherein the controller controls the display to match a GUI corresponding to the electricity use status of the electronic appliance to an area of the screen where the electronic appliance is displayed and display the GUI, and wherein the controller, when the displayed one of the GUIs is selected, generates a menu window including information about electricity use of the electronic appliance corresponding to the selected GUI and a menu to control the electricity use of the electronic appliance corresponding to the selected GUI, and, transmits a control command to control the electricity use of the electronic appliance to the electronic appliance.

11. The portable device of claim 10, further comprising a memory which stores at least one of location information and shape information of the electronic appliance.

12. The portable device of claim 11, wherein the controller identifies the electronic appliance from the image of the electronic appliance using at least one of the stored location and shape information of the electronic appliance.

13. The portable device of claim 10, wherein the one of the plurality of GUIs attributes one of a plurality of different colors to the electronic appliance, wherein each of the plurality of colors corresponds to a different stage of the electricity use status.

14. The portable device of claim 10, wherein the one of the plurality of GUIs displays the electronic appliance by using one of a plurality of different icons, wherein each of the plurality of icons corresponds to a different stage of the electricity use status.

15. The portable device of claim 10, wherein the controller determines the electricity use status of the electronic appliance by determining whether current electricity use of the electronic appliance exceeds a target use or whether a current pattern of using the electronic appliance will lead to exceeding the target use.

16. The portable device of claim 10, wherein the transceiver receives information about electricity pricing at a current time of day, and wherein the controller determines the electricity use status of the electronic appliance by determining whether electricity use at a current moment is relatively high based on the electricity pricing at the current time of the day.

17. The portable device of claim 10, wherein the transceiver receives the electricity use information of the electronic appliance using one of a Wi-fi network, a Zigbee network, an NFC network, and a Bluetooth network.

18. The portable device of claim 10, wherein the electricity use information comprises at least one of a total electricity used so far, a current electricity use, and electricity pricing information regarding the electronic appliance.

19. A mobile terminal comprising:
a camera that captures an image of an area including an electronic appliance;
a transceiver that receives electricity use information of the electronic appliance;
a display that displays the image of the area including the electronic appliance; and
a controller that
identifies the electronic appliance from among a plurality of electronic appliances in the image of the area, the electronic appliance being identified using at least one of a relative location of the electronic appliance to locations of other electronic appliances among the plurality of electronic appliances and a stored shape of the electronic appliance,
determines an electricity use status of the electronic appliance using the received electricity use information,
superimposes a Graphical User Interface (GUI) corresponding to the electricity use status of the electronic appliance, with the electronic appliance in the image,
generates, when the superimposed GUI is selected, a menu window including information about the electricity use of the electronic appliance corresponding to the selected GUI and a menu to control the electricity use of the electronic appliance corresponding to the selected GUI, and
transmits a control command to control the electricity use of the electronic appliance to the electronic appliance.

* * * * *